United States Patent

Near et al.

[11] Patent Number: 6,143,361
[45] Date of Patent: Nov. 7, 2000

[54] METHOD OF REACTING EXCESS CVD GAS REACTANT

[75] Inventors: Daniel L. Near, Montague; Bruce M. Warnes, Muskegon; Stephen M. Winters, Montague, all of Mich.

[73] Assignee: Howmet Research Corporation, Whitehall, Mich.

[21] Appl. No.: 09/175,067

[22] Filed: Oct. 19, 1998

[51] Int. Cl.[7] .................................................. C23C 16/08
[52] U.S. Cl. ........................ 427/248.1; 427/253; 118/715
[58] Field of Search .................. 427/248.1, 253; 118/715; 264/5, 7

[56] References Cited

U.S. PATENT DOCUMENTS

| | | |
|---|---|---|
| 4,923,717 | 5/1990 | Gladfelter et al. . |
| 4,940,213 | 7/1990 | Ohmine et al. ........................ 118/715 |
| 5,091,210 | 2/1992 | Mikoshiba et al. . |
| 5,217,756 | 6/1993 | Shinzawa . |
| 5,250,323 | 10/1993 | Miyazaki . |
| 5,352,656 | 10/1994 | Lackey et al. ........................ 427/250 |
| 5,407,704 | 4/1995 | Basta et al. ........................ 427/248.1 |
| 5,614,247 | 3/1997 | Barbee et al. . |
| 5,648,113 | 7/1997 | Barbee et al. . |
| 5,658,614 | 8/1997 | Basta et al. . |
| 5,672,325 | 9/1997 | Hiratsuka et al. ........................ 423/210 |
| 5,788,747 | 8/1998 | Horiuchi et al. ........................ 427/250 |

Primary Examiner—Shrive Beck
Assistant Examiner—Bret Chen

[57] ABSTRACT

Method and apparatus for controlling deposition from excess gaseous reactant in an exhaust conduit of a chemical vapor deposition apparatus involves introducing a gaseous chemical reactant in the exhaust stream effective to react with the excess gaseous reactant in the exhaust stream to form solid reaction product particulates in a manner that reduces harmful deposition of liquid and/or solid metal in the exhaust system.

12 Claims, 1 Drawing Sheet

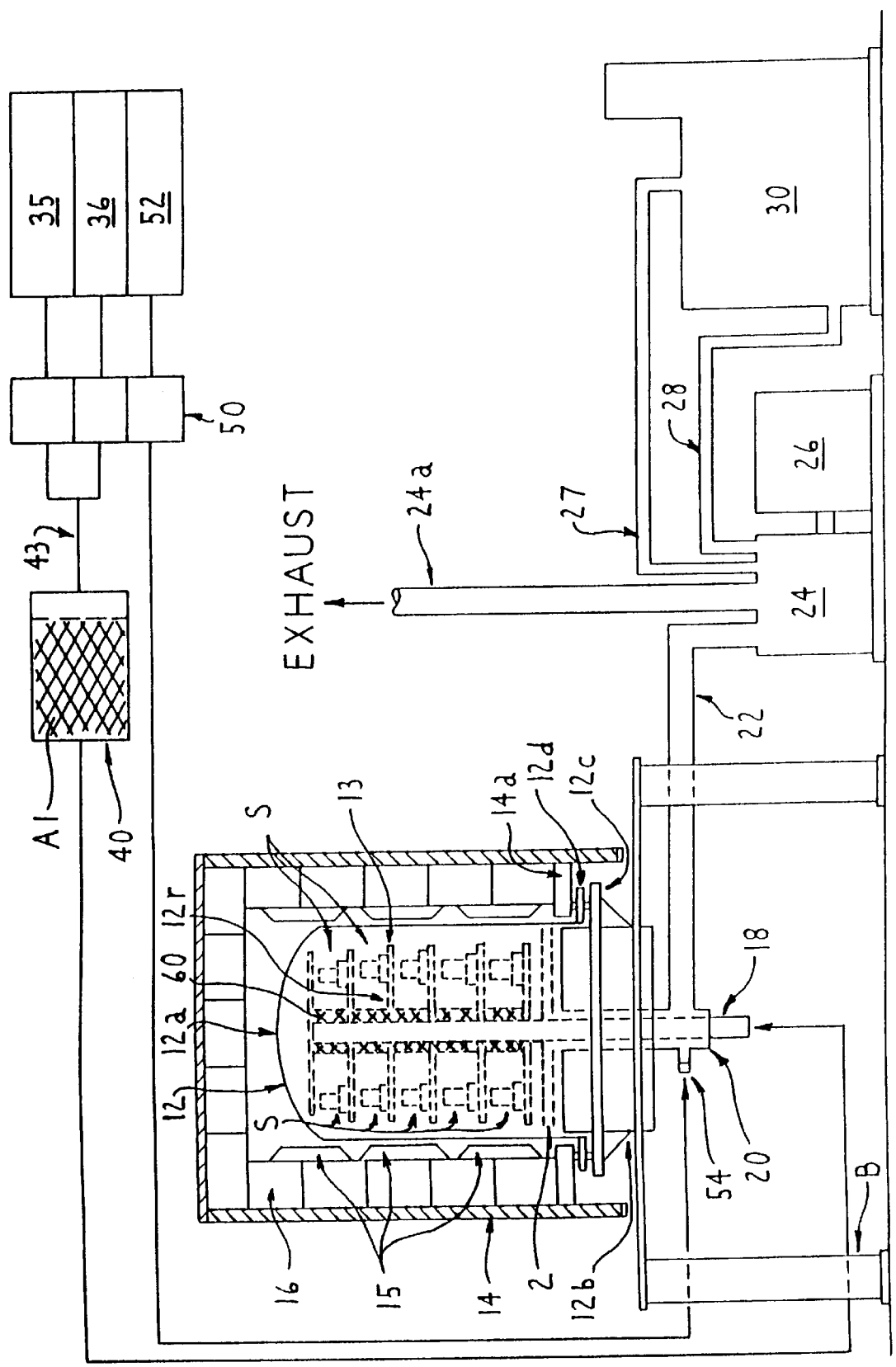

METHOD OF REACTING EXCESS CVD GAS REACTANT

FIELD OF THE INVENTION

The present invention relates to control of excess reactant in the exhaust stream of a chemical vapor deposition (CVD) process to reduce deposition of liquid and/or solid metal from the excess reactant in an exhaust system of the CVD apparatus.

BACKGROUND OF THE INVENTION

Chemical vapor deposition (CVD) involves the generation of metal halide gas at low temperatures (e.g. about 100 to 600 degrees C.), introduction of the metal halide gas into a high temperature retort (e.g. 200 to 1200 degrees C. retort temperature), and reaction of the metal halide with substrates positioned in the retort to form a coating thereon. In general, a large excess of metal halide gas is used to prevent reactant starvation in the high temperature coating retort. Metal halide gases are corrosive and/or toxic, and CVD processes are often performed at reduced pressure. Hence, the off gas system (exhaust system) of the coating retort typically includes a liquid ring vacuum pump filled with a caustic solution to neutralize the excess halide gas mixture.

The deposition of excess CVD reactants in the high temperature retort exhaust system can result in rapid attack of the hardware due to resultant liquid metal deposits or blockage of the exhaust system due to solid or sponge metal deposits from condensation and/or decomposition of the reactants. In a high volume CVD coating production operation, such rapid attack and/or blockage of the retort exhaust system involves time consuming and costly cleaning/repair of the exhaust system between coating runs. Historically, two approaches have been used to prevent deposition of excess CVD reactants in the retort exhaust system. The first involves heating the off gas system to prevent deposition. However, since the boiling or sublimation points of many metal halides of interest are high (e.g. greater than 200 degrees C.), this approach is limited by the availability of high temperature corrosion and oxidation resistant hardware, such as tubing, valves, and joints. In addition, the required heating equipment (e.g. heaters, heater controls and the like) increases the cost, complexity and maintenance of the CVD apparatus.

A second approach involves a trap or condenser placed at the beginning of the exhaust system. This approach is common in commercially available CVD tool coating equipment. CVD ceramic hard facing of cutting tools involves the reaction of metal halide vapor with a second gas to form a compound coating (e.g. oxide, nitride, etc.) on the tool. Consequently, the coating retort exhaust often contains solid reaction products which can be collected in a trap located just outside the retort. U.S. Pat. No. 5,261,963 describes condensing excess metal halide gas from CVD aluminizing inside the coating retort using a gettering screen. As is the case with heating the exhaust system, use of internal and/or external exhaust traps or condensers increases both the capital and the maintenance costs of CVD apparatus.

There thus is a need to control and reduce deposition of liquid and/or solid metal from excess gaseous reactant in an exhaust stream of CVD apparatus and to reduce the need for cleaning/repair of the exhaust system between coating runs.

It is an object of the present invention to satisfy these needs.

SUMMARY OF THE INVENTION

The present invention involves method and apparatus for controlling harmful deposition from excess CVD gaseous reactant in an exhaust conduit of CVD coating apparatus by introduction of a gaseous chemical reactant in the exhaust stream effective to react with one or more excess gaseous reactant constituents to form solid reaction products in a manner that reduces harmful deposition of liquid and/or solid metal in the CVD exhaust system.

In an embodiment of the present invention offered for purposes of illustration and not limitation, the invention involves introducing a gaseous reactant to the exhaust stream of a CVD retort to react with excess metal halides therein, such as excess aluminum chlorides and subchlorides, to form as reaction products finely divided metal oxide, metal carbide, metal nitrides, and other particulates that are carried by the exhaust gas stream to a scrubber for removal and/or are deposited as a thin layer of residue on the exhaust conduit, the residue being easily removed by washing the exhaust conduit with water between coating runs. An illustrative reactant is carbon dioxide that forms metal oxide and metal carbide powder particles on the exhaust conduit.

The present invention can be practiced and is advantageous in a high volume CVD coating production operation to avoid rapid attack and/or blockage of the retort exhaust system experienced heretofore. The present invention provides an inexpensive and effective solution to the problem of rapid attack and/or blockage of the retort exhaust system without the need for complex and costly capital equipment additions to CVD apparatus.

The above and other objects and advantages of the present invention will become more readily apparent from the following detailed description taken with the following drawing.

DESCRIPTION OF THE DRAWINGS

The FIGURE is a schematic view of a CVD coating retort and exhaust system for exhausting excess metal halide reactant from the retort.

DESCRIPTION OF THE INVENTION

Referring to the FIGURE, CVD coating apparatus and associated exhaust system are schematically shown. The CVD coating apparatus comprises a reactor or retort 12 comprising a metal shell disposed in a refractory-lined heating furnace 14 that is lowered to the operative position shown disposed about the retort 12 for heating it to an appropriate elevated CVD temperature and that can be raised at the end of a CVD run to allow substrates S within the retort 12 to be removed therefrom. The furnace 14 can be raised/lowered by a conventional overhead crane or other mechanical mechanism (not shown) forming no part of the present invention. The furnace 14 includes electrical resistance heating elements 15 on the inner side of the refractory lining 16. An O-ring is provided as shown to form a seal between inwardly extending flange 14a of the furnace and a flange 12d of the retort 12.

The substrates S are loaded into and removed from the retort 12 by separating the retort metal shell 12a from the retort base 12b using the overhead crane or other mechanical mechanism. The substrates S are disposed on a plurality of trays or shelves 13 that are disposed on a central gaseous reactant supply tube or conduit 18. The retort base 12b is fixed on a support base B that rests on the floor of the CVD facility. The retort base 12b includes an annular support surface flange 12c on which outwardly extending flange 12d of the retort shell 12a sits with an O-ring therebetween during a CVD run as illustrated in the FIGURE.

Disposed proximate the bottom of the retort 12 are a plurality of stacked, axially spaced apart radiant heat shields 2. These heat shields comprise superalloy plates and are disposed on the central gaseous reactant supply tube 18. The heat shields function to reduce radiant energy directed at the base 12b of the retort. Gettering screens (not shown) of the type described by Basta et al. in U.S. Pat. Nos. 5,261,963 and 5,407,704, the teachings of which are incorporated herein by reference, can optionally be present disposed between the heat shields 2 and about the central reactant supply conduit 18 in a manner that the exhaust gases/excess gaseous reactants must pass through the gettering screens before entering the outer exhaust tube or conduit 20 disposed about the supply conduit 18. However, the gettering screen(s) are not required in practice of the present invention.

The central gaseous reactant supply conduit 18 is disposed concentrically within the outer exhaust tube or conduit 20 that extends through the base 12b and communicates to the retort interior below the heat shields 2.

The exhaust tube or conduit 20 includes a laterally extending horizontal connector conduit 22 that communicates to a conventional liquid ring vacuum pump 24 and electric pump motor 26. The temperature of conduit 22 should exceed the boiling point of aluminum trichloride being exhausted therein and may require heating by conventional electrical heating elements (not shown) to this end.

The vacuum pump 24 is filled with a caustic solution to neutralize the excess halide gas mixture and is available commercially as model KLRC from Kinney Vacuum Co., Canton, Mass. The pump 24 includes an exhaust pipe 24a that exhausts hydrogen and/or argon to ambient atmosphere. The pump 24 communicates via first and second conduits 27, 28 to a caustic solution reservoir and settling tank 30.

Gaseous CVD reactants are introduced into the retort interior via the central supply conduit 18. The gaseous reactants are generated by well known conventional generators. For purposes of illustration and not limitation, the generators can comprise one or more conventional low temperature (e.g. about 100 to 600 degrees C.) metal halide gas generator 40 located exteriorly of the retort 12 and communicated to the interior thereof by conduit 18 which is heated to maintain proper reactant gas temperature and prevent condensation of the metal halide gas therein.

The metal gas generator 40 typically is supplied via conduit 43 with a gas flow comprising a mixture of an acid halide gas, such as for example only, HCl or HF gas, and a reducing or inert carrier gas, such as hydrogen, argon, or mixtures thereof, from suitable sources 35 and 36.

An exemplary low temperature metal halide generator 40 to form an oxidation and corrosion resistant aluminide coating on the substrates S comprises a bed Al of aluminum pellets and a heating device (not shown) to heat the pellets to a desired reaction temperature depending upon the acid halide gas to be supplied thereto. For purposes of illustration and not limitation, a pellet temperature of about 300 degrees C. can be used for HCl gas.

The acid halide/carrier gas flow is supplied to the generator 40 to flow over the heated pellets under conditions of temperature, pressure, and flow rate to form aluminum trichloride gas in desired proportion to the carrier gas. The resulting aluminum halide/carrier gas mixture is supplied from generator 40 as gaseous reactant stream to the retort interior work zone 12r via the supply conduit 18. The vacuum pump 24 communicated to the retort interior maintains a desired pressure of the gaseous reactant stream through generator 40 and to exhaust spent coating gas from the retort work zone 12r.

The gaseous reactant stream from the external generator 40 optionally may be flowed through a reactivity-altering bed 60 of material residing within the work zone 12r as described in U.S. Pat. Nos. 5,264,245 and 5,462,013 to increase the reactivity of the coating gas, for example, by converting the aluminum trichloride gas to more reactive aluminum subchloride gases, such as $AlCl_2$ and $AlCl$ (a higher activity form of Al). The teachings of the patents are incorporated herein by reference to this end.

The aluminum chloride/carrier gas mixture or higher activity aluminum subchlorides/carrier gas mixture passes over the external and optionally the internal surfaces of the heated substrates S (e.g. 200 to 1200 degrees C. retort temperature) to form an appropriate diffusion aluminide or other coating thereon depending upon the CVD coating gas composition, CVD parameters, etc. used.

The invention is not limited to any particular CVD reactant gas generator, to any particular gas reactant composition, or to any particular CVD coating parameters of temperature, pressure and time that might be used. A variety of coatings may be formed using the CVD retort including, but not limited to, simple or modified (e.g modified by inclusion of Pt, Pd, Y, Hf, Zr, Si, etc.) diffusion aluminide coatings commonly applied to gas turbine engine blades and vanes comprising nickel and/or cobalt base superalloys. The diffusion aluminide coatings may be applied to the substrates under CVD conditions that form inwardly grown or outwardly grown simple or modified diffusion aluminide coatings. U.S. Pat. No. 5,658,614 and Ser. Nos. 08/685 380, now U.S. Pat. 5,989,733 and 08/197 497, of common assignee herewith describe CVD coating parameters for forming outwardly grown diffusion aluminide coatings.

As mentioned above, a large excess of the metal halide gaseous reactant (e.g. aluminum chloride and/or subchlorides) is used during CVD coating to prevent reactant starvation in the high temperature coating retort 12. For example, typically less than 10% of the initial gaseous reactants are used up in the CVD retort 12. Thus, the exhaust gas drawn through the conduits 20 and 22 includes carrier gas and also excess, unreacted coating gas, such as unreacted metal halide gases, which in forming diffusion aluminide coatings includes aluminum trichloride and/or aluminum subchlorides. As also mentioned, deposition from excess CVD reactants in the retort exhaust system can result in rapid attack of the hardware due to liquid metal deposits or blockage of the exhaust system due to solid or sponge metal deposits. In a high volume CVD coating production operation, such rapid attack and/or blockage of the retort exhaust system involves time consuming and costly cleaning/repair of the exhaust system between coating runs.

For example, in forming high activity diffusion aluminide coatings on superalloy substrates in the retort 12 at about 1010 degrees C. and greater retort temperatures using a coating gas comprising a mixture of $AlCl$, $AlCl_2$, and $AlCl_3$ to form an inwardly grown aluminide coatings, the excess reactants produce significant metallic aluminum sponge deposition in and blockage of the exhaust conduit 22 over a 10 hour CVD coating run, requiring cleaning of the exhaust conduit and substantial production downtime, given that the exhaust conduit 22 on a production CVD exhaust system has a diameter of 3 inches and length of approximately 15 feet from the retort to the vacuum pump 24. Moreover, build-up of the metallic aluminum sponge in the conduit 22 creates control problems with respect to coating gas flow through the retort and retort pressure.

The present invention provides method and apparatus for controlling deposition of excess CVD gaseous reactant in the exhaust stream exhausted for example from work zone 12r through the exhaust conduit 20 communicated to the vacuum pump 24. The invention involves introduction of a gaseous chemical reactant into the exhaust stream exiting from the retort 12 through conduits 20 and 22 to react with one or more excess gaseous reactant constituents to form solid reaction products in a manner that reduces harmful deposition of liquid and/or solid metallic material in the CVD exhaust system (e.g. especially exhaust conduit 22).

In an embodiment of the present invention offered for purposes of illustration and not limitation, the invention involves introducing an oxidizing, nitriding, and/or carbiding gaseous chemical reactant, such as carbon dioxide, carbon monoxide, nitrogen oxides, and other gases that react with aluminum chlorides to form more stable compounds, into the exhaust stream of a CVD retort 12 to react with excess metal halides, such as excess aluminum chlorides and subchlorides in the above exemplary embodiment, to form as reaction products finely divided metal oxide, carbide, nitride and other particulates that are carried by the exhaust gas stream to the pump 24 and subsequently to the settling tank 30 for removal, and/or are deposited as a thin layer of powder residue on the interior surface of exhaust conduit 22 with the residue being easily removed by washing the exhaust conduit 22 with water between coating runs.

The gaseous chemical reactant is introduced pursuant to an illustrative embodiment of the invention via a mass flow controller 50 connected to a source 52 of the gaseous chemical reactant, such as a high pressure cylinder of gaseous reactant chemical, FIG. 1. The mass flow controller can comprise a conventional flow controller available as model 202 from Porter Instrument Co., Hatfield, Pa., to meter the gaseous chemical reactant into the exhaust conduit 20 via a fitting 54 on the conduit 20.

The gaseous chemical reactant is metered at a flow rate sufficient to react with excess gaseous reactant constituents, such as for example aluminum trichloride and subchlorides in the exemplary embodiment, to form solid reaction products in a manner that reduces harmful deposition of liquid and/or solid metal (e.g. liquid and/or sponge aluminum) in the CVD exhaust system, especially in exhaust conduit 22.

For example, in the aforementioned process forming high activity diffusion aluminide coatings on superalloy substrates in the retort 12 at about 1010 degrees C. and greater retort temperatures using a coating gas comprising a mixture of AlCl, $AlCl_2$, and $AlCl_3$ over a 10 hour coating run, carbon dioxide was metered from a high pressure $CO_2$ cylinder into the exhaust conduit 20 at the fitting 54 using the mass flow controller 50 at a rate of 13 scfh (standard cubic feet per hour) for an exhaust gas stream flow rate of 1084 scfh. The introduction of carbon dioxide in this manner produced a thin (less than ¼ inch) layer of fine solid powder residue on the interior surface of exhaust conduit 22 after the 10 hour run. The powder residue layer was easily washed out of conduit 22 with water using a garden hose.

X-ray diffraction analysis of the fine powder residue in the exhaust conduit 22 indicated the presence of $Al_2O_3$, $Al_4C_3$, and aluminum metal as small spheres (e.g. 1 micron diameter spheres) coated with aluminum oxide. Temperature measurements indicated that the exhaust gas temperature in the conduit 20 was about 800 degrees C. near where the carbon dioxide gas was introduced. Apparently, the formation of the aluminum oxide coated aluminum spheres was the result of non-equilibrium conditions that carbon dioxide starvation produces, although applicants do not wish to be bound by any theory in this regard. Generally, as the flow rate of carbon dioxide is increased in the conduits 20 and 22, the thickness of solid powder residue layer decreases eventually to near zero and the fraction of coated aluminum spheres in the residue decreases.

The present invention can be practiced and is advantageous in a high volume CVD coating production operation to avoid rapid attack and/or blockage of the retort exhaust system experienced heretofore. The present invention provides an inexpensive and effective solution to the problem of rapid attack and/or blockage of the retort exhaust system without the need for complex and costly capital equipment additions to CVD apparatus.

We claim:

1. A method of reacting excess gaseous reactant in an exhaust stream of an exhaust conduit of a chemical vapor deposition apparatus, comprising introducing a gaseous chemical reactant to the exhaust stream so as to react with said excess gaseous reactant to form solid reaction product particulates in said exhaust stream.

2. The method of claim 1 wherein the exhaust stream passes through said exhaust conduit and said chemical reactant is introduced into said exhaust conduit proximate a chemical vapor deposition retort.

3. The method of claim 2 wherein said exhaust conduit communicates with a scrubber that removes said reaction product particulates from said exhaust stream.

4. The method of claim 1 wherein said chemical reactant selected from the group consisting of an oxdizing reactant, carburizing reactant, and a nitriding reactant is introduced to said exhaust stream that includes a gaseous metal halide.

5. The method of claim 4 wherein the metal halide includes aluminum halides.

6. The method of claim 5 wherein said aluminum halides are selected from the group consisting of aluminum trichloride and subchlorides.

7. The method of claim 4 wherein said chemical reactant is selected from the group consisting of carbon dioxide, carbon monoxide, nitrogen oxides, and other gases that react with said metal halide to form a more stable compound.

8. The method of claim 1 wherein said chemical reactant reacts with said excess gaseous reactant to form solid particulates selected from the group consisting of oxides, carbides, nitrides, and mixtures and solid solutions thereof.

9. A method of reacting excess gaseous aluminum halide reactant in an exhaust stream of an exhaust conduit of a chemical vapor deposition aluminizing apparatus, comprising introducing to the exhaust stream a gaseous chemical reactant that reacts with said aluminum halide reactant to form solid reaction product particulates in said exhaust stream.

10. The method of claim 9 wherein the aluminum halide is selected from the group consisting of aluminum trichlorides and subchlorides.

11. The method of claim 9 wherein said chemical reactant is selected from the group consisting of an oxidizing, carbiding and nitriding reactant.

12. The method of claim 9 wherein said chemical reactant reacts with said aluminum halide reactant to form solid particulates selected from the group consisting of aluminum oxide, aluminum carbide, and mixtures and solid solutions thereof.

* * * * *